United States Patent
Otremba et al.

(10) Patent No.: US 8,120,161 B2
(45) Date of Patent: Feb. 21, 2012

(54) SEMICONDUCTOR MODULE INCLUDING SEMICONDUCTOR CHIPS COUPLED TO EXTERNAL CONTACT ELEMENTS

(75) Inventors: Ralf Otremba, Kaufbeuren (DE); Lutz Goergens, Villach (AT); Gerhard Noebauer, Villach (AT); Tien Lai Tan, Melaka (MY); Erwin Huber, Munich (DE); Marco Puerschel, Munich (DE); Gilles Delarozee, Munich (DE); Markus Dinkel, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 750 days.

(21) Appl. No.: 11/733,658

(22) Filed: Apr. 10, 2007

(65) Prior Publication Data
US 2008/0251859 A1 Oct. 16, 2008

(51) Int. Cl.
*H01L 27/88* (2006.01)
(52) U.S. Cl. ........ 257/690; 257/390; 257/734; 257/700; 257/693; 257/666; 257/676; 257/E21.505; 257/E23.01; 257/E27.06; 257/E23.031; 257/E23.009; 257/E23.053; 257/E23.055; 257/738; 257/735; 438/107
(58) Field of Classification Search .................. 257/690, 257/734, 738, E21.506, E23.009, E23.055, 257/390, E21.505, E23.01, E27.06, E23.041; 438/107
See application file for complete search history.

(56) References Cited

U.S. PATENT DOCUMENTS

| 4,862,344 | A | | 8/1989 | Emoto | |
|---|---|---|---|---|---|
| 5,043,859 | A | * | 8/1991 | Korman et al. | 363/147 |
| 5,094,753 | A | * | 3/1992 | Allington et al. | 210/634 |
| 5,438,021 | A | | 8/1995 | Tagawa et al. | |
| 6,165,820 | A | * | 12/2000 | Pace | 438/125 |
| 6,448,643 | B2 | * | 9/2002 | Cheah et al. | 257/723 |
| 6,794,742 | B2 | | 9/2004 | Kawafuji et al. | |
| 6,818,971 | B2 | | 11/2004 | Oda et al. | |
| 7,173,333 | B2 | | 2/2007 | Hata et al. | |
| 2001/0045627 | A1 | * | 11/2001 | Connah et al. | 257/666 |
| 2003/0075796 | A1 | * | 4/2003 | Hata et al. | 257/734 |
| 2005/0121777 | A1 | * | 6/2005 | Hata et al. | 257/713 |
| 2005/0127483 | A1 | * | 6/2005 | Joshi et al. | 257/676 |
| 2005/0280125 | A1 | * | 12/2005 | Oliver et al. | 257/676 |
| 2006/0151868 | A1 | * | 7/2006 | Zhu et al. | 257/690 |
| 2007/0139988 | A1 | * | 6/2007 | Malherbe et al. | 365/43 |

FOREIGN PATENT DOCUMENTS
JP 2007-073581 A 3/2007
* cited by examiner

*Primary Examiner* — Marc Armand
(74) *Attorney, Agent, or Firm* — Slater & Matsil, L.L.P.

(57) ABSTRACT

A component includes a first semiconductor chip attached to a first carrier and second semiconductor chip attached to a second carrier. The first carrier has a first extension, which forms a first external contact element. The second carrier has a second extension, which forms a second external contact element. The first and the second carriers are arranged in such a way that the first and the second extension point in different directions.

23 Claims, 6 Drawing Sheets

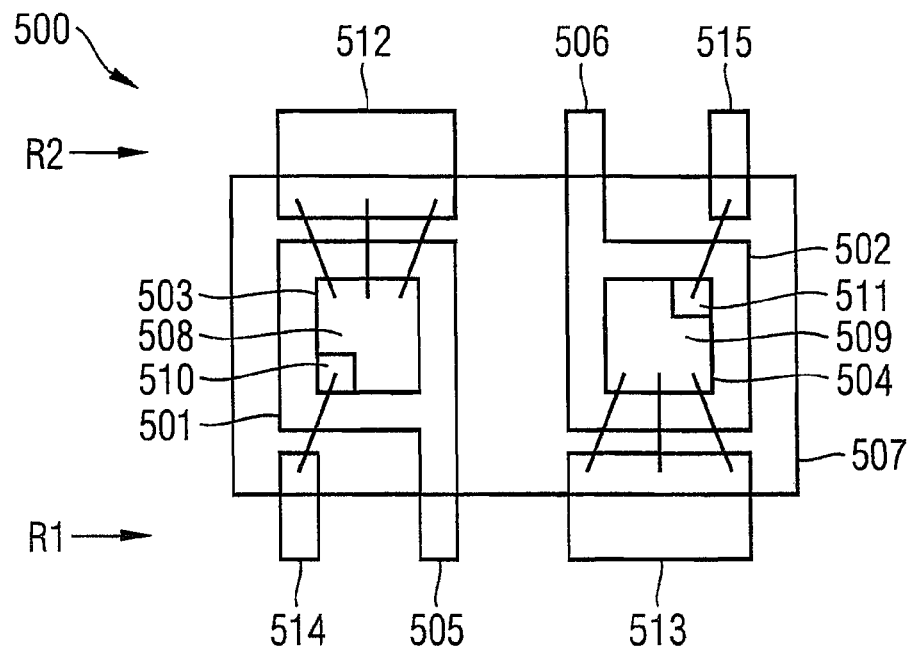
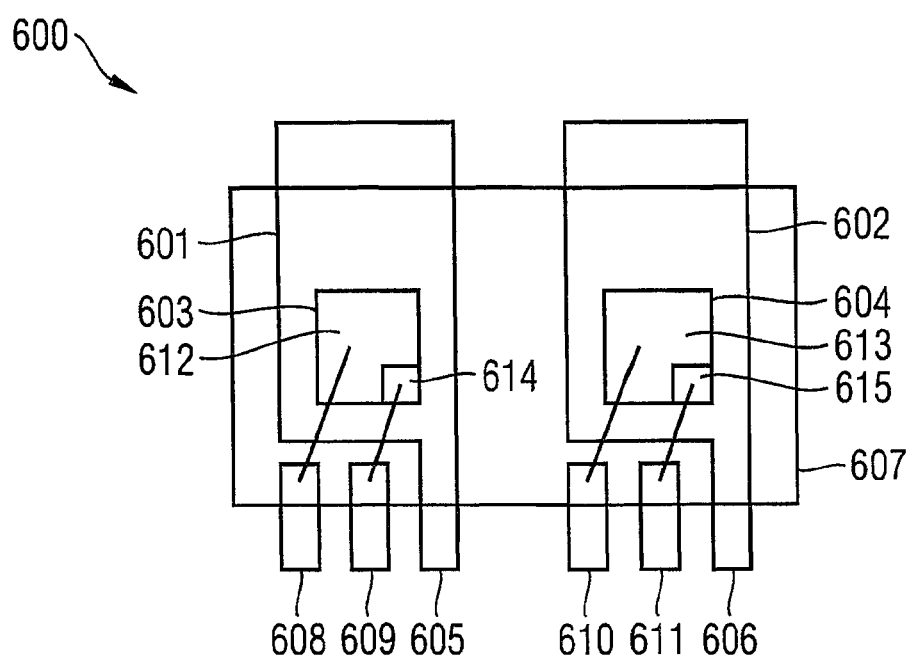

SEMICONDUCTOR MODULE INCLUDING SEMICONDUCTOR CHIPS COUPLED TO EXTERNAL CONTACT ELEMENTS

TECHNICAL FIELD

The invention relates to a semiconductor component and a method for producing a semiconductor component.

BACKGROUND

Power semiconductor chips, for example, can be integrated into semiconductor components. Power semiconductor chips are suitable in particular for the switching or control of currents and/or voltages.

SUMMARY OF THE INVENTION

Against this background, a component in accordance with embodiments of the invention, an electronic module in accordance with embodiments of the invention and a method in accordance with embodiments of the invention are specified. Advantageous developments and configurations are described herein.

In accordance with one configuration, a component comprises a first carrier, a second carrier, a first semiconductor chip applied to the first carrier, and a second semiconductor chip applied to the second carrier. The two semiconductor chips in each case have a vertical structure. The first carrier has a first extension, which forms a first external contact element. The second carrier has a second extension, which forms a second external contact element. The first and the second carrier are arranged in such a way that the first and the second extension point in different directions.

In accordance with a further configuration, a component comprises external contact elements arranged in at least two series, a first power transistor and a second power transistor. A drain terminal of the first power transistor is connected to a first external contact element from among the external contact elements. A source terminal of the second power transistor is connected to a second external contact element from among the external contact elements. The first and the second external contact element are arranged in the same, first series.

In accordance with a further configuration, a component comprises external contact elements arranged in at least two series, a power transistor and a power diode. A drain terminal of the power transistor is connected to a first external contact element from among the external contact elements. An anode terminal of the power diode is connected to a second external contact element from among the external contact elements. The first and the second external contact elements are arranged in the same, first series.

In accordance with a further configuration, a component comprises external contact elements arranged in a series, a first power transistor and a second power transistor. A drain terminal of the first power transistor is connected to a first external contact element from among the external contact elements. A source terminal of the second power transistor is connected to a second external contact element from among the external contact elements. The first and the second external contact elements are arranged adjacent.

In accordance with a further configuration, a component comprises external contact elements arranged in a series, a power transistor and a power diode. A drain terminal of the power transistor is connected to a first external contact element from among the external contact elements. An anode terminal of the power diode is connected to a second external contact element from among the external contact elements. The first and the second external contact elements are arranged adjacent.

BRIEF DESCRIPTION OF THE DRAWINGS

The invention is explained in more detail below in an exemplary manner with reference to the drawings, in which:

FIG. 5 shows a schematic illustration of a component 500 as a further exemplary embodiment;

FIG. 6 shows a schematic illustration of a component 600 as a further exemplary embodiment;

DETAILED DESCRIPTION OF ILLUSTRATIVE EMBODIMENTS

Figure 1:
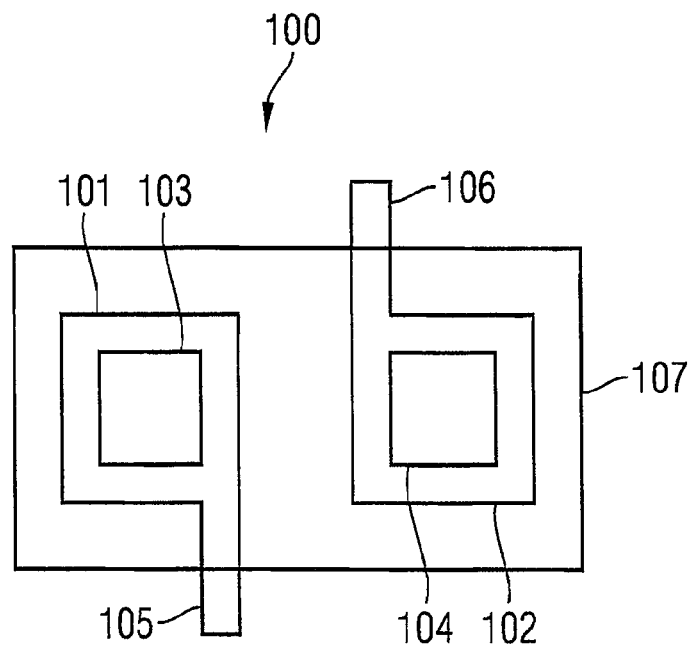
FIG. 1 shows a schematic illustration of a component 100 as an exemplary embodiment.

Components that contain semiconductor chips are described below. The specific embodiment of the semiconductor chips is not of importance in this case. The semiconductor chips may be for example integrated circuits of any desired form, e.g., power transistors, power diodes, microprocessors or microelectromechanical components. In particular, semiconductor chips having a vertical structure may be involved. That is to say, the semiconductor chips may be fabricated in such a way that electric currents can flow in a direction perpendicular to the main surfaces of the semiconductor chip. A semiconductor chip having a vertical structure may have contact elements in particular on its two main surfaces, e.g., on its top side and underside. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. The semiconductor chips do not have to be fabricated from a specific semiconductor material; they may additionally also contain non-conductive inorganic and/or organic materials. The semiconductor chips may be packaged or unpackaged.

The semiconductor chips may have contact elements that enable electrical contact to be made with the semiconductor chips. The contact elements may comprise an arbitrary conductive material, for example, a metal, such as, e.g., aluminum, gold or copper, a metal alloy or a conductive organic material.

The semiconductor chips may be arranged on carriers. The carriers may serve, inter alia, as a heat sink for dissipating the heat generated by the semiconductor chips. The carriers may comprise electrically conductive materials, such as, e.g., copper or iron-nickel alloys. The carriers may in each case be electrically connected to a contact element of the semiconductor chip by which the semiconductor chip is seated on the carrier. The electrical connections may be produced, e.g., by reflow soldering, vacuum soldering, diffusion soldering or adhesive bonding by means of a conductive adhesive.

If diffusion soldering is used as a connecting technique between carrier and semiconductor chip, it is possible to use solder materials that lead to intermetallic phases after the end of the soldering operation at the interface between carrier and semiconductor chip on account of interface diffusion processes. In this case, the use of AuSn, AgSn, CuSn, AgIn, AuIn or CuIn solders is conceivable, for example, for copper or iron-nickel carriers.

If the carriers are adhesively bonded to the semiconductor chips, it is possible to use conductive adhesives. The adhesives may be based, e.g., on epoxy resins and be enriched with gold, silver, nickel or copper in order to produce the electrical conductivity.

The carriers may have extensions. An extension of a carrier may be, for example, a tapering of the carrier in a specific direction. In particular, the extension may be integrally connected to the carrier. Two respective carriers may have extensions pointing in different directions. Accordingly, with the exception of their pointing in the same direction, the two extensions can form arbitrary angles with one another. In particular, the extensions may point in opposite directions. The different directions of the two extensions may be realized by the associated carriers being rotated relative to one another. The semiconductor chips applied to the carriers may likewise be rotated relative to one another; however, they may also be oriented identically. Furthermore, the semiconductor chips may be rotated relative to one another at different angles than the associated carriers.

The contact elements of the semiconductor chips may have a diffusion barrier. The diffusion barrier prevents solder material from diffusing from the carrier into the semiconductor chip during diffusion soldering. A thin titanium layer on a contact element brings about such a diffusion barrier, by way of example.

FIG. 1 illustrates a component 100 in a plan view as an exemplary embodiment. The component 100 contains a first and a second carrier 101 and 102. A first and a second semiconductor chip 103 and 104 are arranged on the carriers 101 and 102. The semiconductor chips 103, 104 in each case have a vertical structure. The carriers 101, 102 and the semiconductor chips 103, 104 can be integrated into a common housing 107. The carriers 101, 102 each have an extension 105, 106, which forms a first external contact element 105 and a second external contact element 106, respectively, outside the housing 107. On condition that they point in different directions, the extensions 105, 106 may be arranged at arbitrary angles with respect to one another. The first and/or the second carrier 101, 102 may be electrically conductive. The first semiconductor chip 103 may have a first contact element on a first main surface, which faces the carrier 101. The first contact element of the semiconductor chip 103 may be electrically connected to the carrier 101. The second semiconductor chip 104 may likewise have a first contact element on a first main surface, which faces the carrier 102. The first contact element of the semiconductor chip 104 may be electrically connected to the carrier 102.

The "pointing in different directions" of the first and the second extension essentially relates to the direction that the carrier extensions exhibit in plan view, that is to say in a plane parallel to the chip plane. In the accompanying figures, this corresponds in each case to the paper plane.

Figure 2:
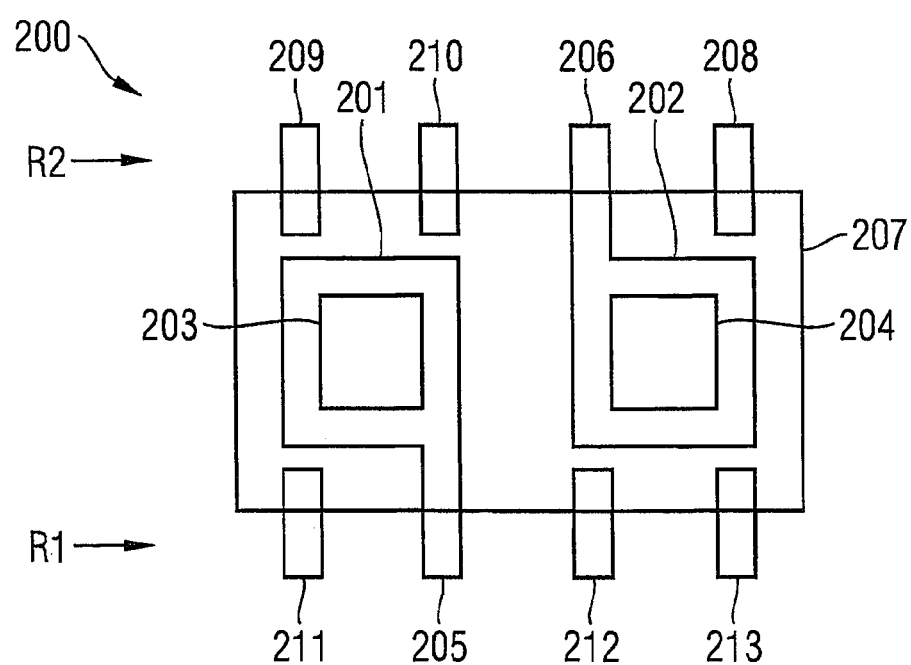
FIG. 2 shows a schematic illustration of a component 200 as a further exemplary embodiment.

FIG. 2 shows a component 200 as a development of the component 100 illustrated in FIG. 1. Alongside the extensions 205, 206 of the carriers 201, 202, FIG. 2 shows further external contact elements 208 to 213, which lead contact elements of the semiconductor chips 203, 204 through the housing 207 towards the outside. The external contact elements 205, 211, 212 and 213 form a first series R1 of external contact elements, and the external contact elements 206, 208, 209 and 210 form a second series R2 of external contact elements. The semiconductor chips 203, 204 may be, for example, MOSFET power transistors, wherein the drain terminal of the power transistor 203 may be coupled to the external contact element 205 and the source terminal of the power transistor 204 may be coupled to the external contact element 212. The external contact elements 205 and 212 are arranged in the same series R1, and in particular alongside one another. If the semiconductor chips 203, 204 are bipolar power transistors, the collector terminal of the power transistor 203 is coupled to the external contact element 205 and the emitter terminal of the power transistor 204 is coupled to the external contact element 212.

As an alternative, the second semiconductor chip 204 of FIG. 2 may be a semiconductor diode, and in particular a power diode. In this case, the anode terminal of the semiconductor diode 204 may be coupled to the external contact element 212.

Figure 3:
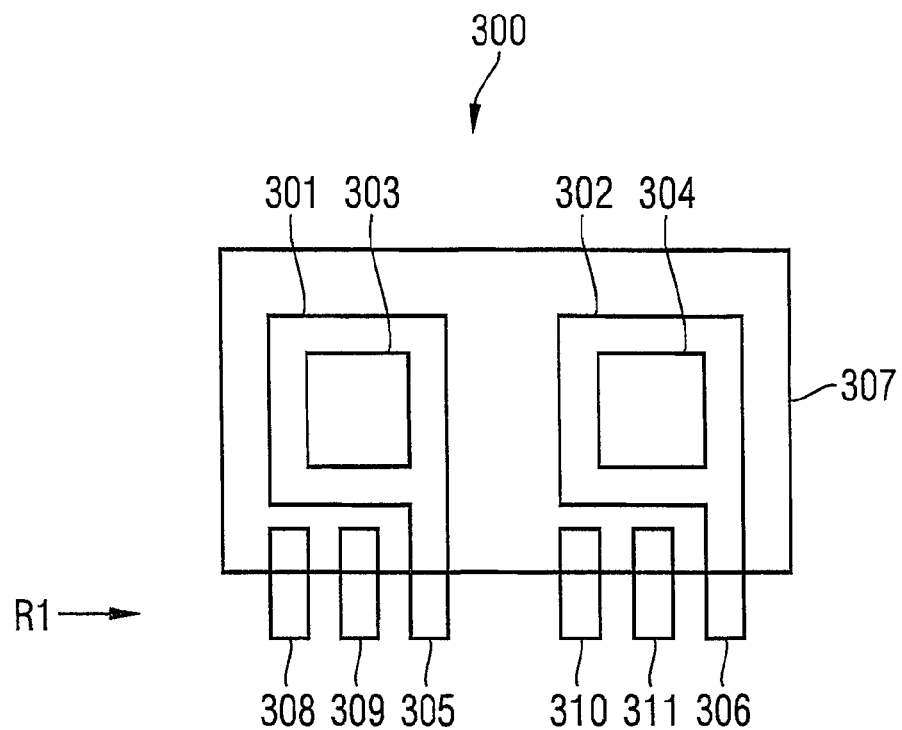
FIG. 3 shows a schematic illustration of a component 300 as a further exemplary embodiment.

FIG. 3 illustrates a component 300 as a further exemplary embodiment. Semiconductor chips 303, 304 are mounted onto carriers 301, 302. The carriers 301, 302 have extensions 305, 306 that are formed as external contact elements and that lead contact elements of the semiconductor chips 303, 304 through a housing 307 towards the outside. Further external contact elements 308 to 311 are provided for leading other contact elements of the semiconductor chips 303, 304 towards the outside. The external contact elements 305, 306 and 308 to 311 form a series R1. The semiconductor chips 303, 304 may be power transistors. The drain terminal of the semiconductor chip 303 may be connected to the external contact element 305, and the source terminal of the semiconductor chip 304 may be connected to the external contact element 310. The external contact elements 305 and 310 may be arranged adjacent.

As an alternative, the semiconductor chip 304 may be a semiconductor diode, and in particular a power diode. In this case, the anode terminal of the semiconductor diode 304 may be connected to the external contact element 310.

Figure 4:
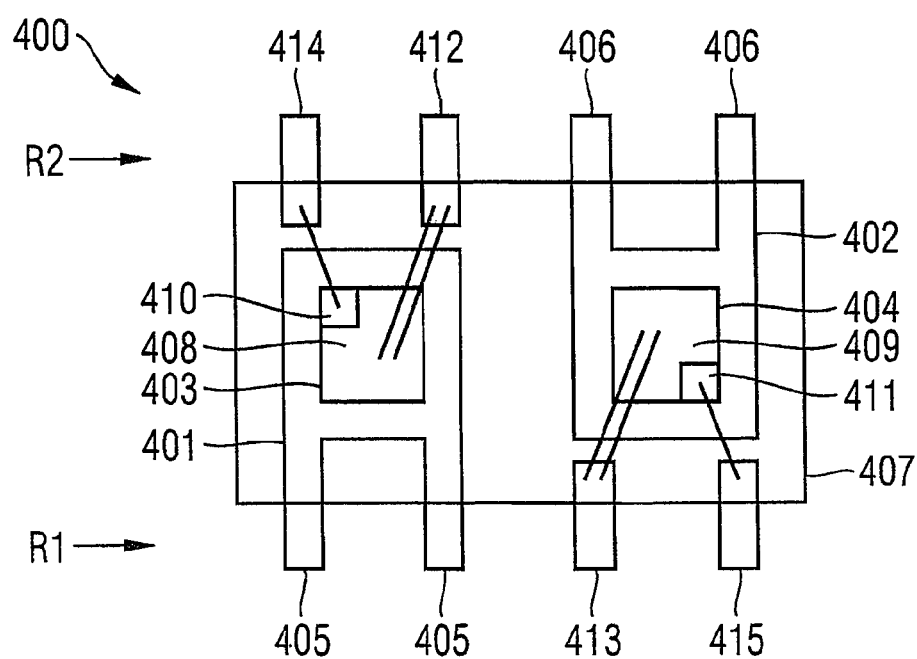
FIG. 4 shows a schematic illustration of a component 400 as a further exemplary embodiment.

FIG. 4 shows a component 400 as a development of the component 100 illustrated in FIG. 1. Each of the carriers 401, 402 has two extensions 405, 406, wherein the extensions 405, 406 of the carriers 401, 402 point in different directions. A semiconductor chip 403, 404, which may be a power transistor, for example, has been applied to each of the carriers 401, 402, which may be electrically conductive. The two semiconductor chips 403, 404 each have a first main surface and, in the first main surface, in each case a contact element, the drain terminal. The drain terminals of the semiconductor chips 403, 404 are in each case seated on the carriers 401, 402 and are electrically connected thereto. The extensions 405, 406 form external contact elements with which contact can be made with the drain terminals from outside the housing 407. A second contact element 408, 409, the source terminal, and a third contact element 410, 411, the gate terminal, are in each case arranged on a second main surface of the semiconductor chips 403, 404. The source terminals 408, 409 are connected to external contact elements 412 and 413, respectively, by means of bonding wires in the interior of the housing 407. Furthermore, the gate terminals 410, 411 are connected to external contact elements 414, 415 by means of bonding wires in the interior of the housing 407.

The external contact elements 405, 413 and 415 form a first series R1 of external contact elements, and the external contact elements 406, 412 and 414 form a second series R2 of external contact elements. In this case, the external contact elements 405 and 413, and 406 and 412, are respectively arranged alongside one another.

The contact elements 408 to 411 of the semiconductor chips 403, 404 may in each case be connected to the associated external contact elements 412 to 415 by means of one or a plurality of bonding wires. The larger the number of bonding wires or the larger the diameter of the individual bonding wires, the smaller the electrical resistance between the respective contact element and the associated external contact element. This is advantageous particularly in the case of the source terminals 408 and 409, since large currents often flow via said contacts.

In the case of the component 400, the carriers 401, 402 are rotated by 180° relative to one another. The semiconductor chips 403, 404 are likewise rotated by 180° relative to one another. It is also conceivable for the semiconductor chips 403, 404 not to be rotated relative to one another, but rather to be oriented identically or to be rotated relative to one another by a different angle than the carriers 401, 402.

FIG. 5 shows a further development of the component 100 illustrated in FIG. 1 in the form of a component 500. In contrast to the component 400, the carriers 501, 502 of the component 500 have only one extension 505, 506 in each case. Furthermore, the source terminals 508, 509 are in each case connected to only one external contact element 512, 513 by means of bonding wires, wherein the external contact elements 512, 513 can be made larger than the external contact elements 412, 413 of the component 400. The gate terminals 510, 511 of the component 500 are connected to external contact elements 514, 515 by means of bonding wires. The external contact elements 505, 513 and 514 and the external contact elements 506, 512 and 515 are in each case arranged in a series R1 and R2, respectively.

FIG. 6 illustrates a component 600 as a development of the component 300. In the case of the component 600, the semiconductor chips 603, 604 have source terminals 612, 613 and also gate terminals 614, 615 on the main surfaces not facing the carriers 601, 602. The source and gate terminals 612 to 615 are connected to the external contact elements 608 to 611 by means of bonding wires in the manner illustrated in FIG. 6. In this case, the external contact element 605, which is connected to the drain terminal of the power transistor 603, and the external contact element 610, which is connected to the source terminal 613 of the power transistor 604, are arranged alongside one another. Furthermore, the carriers 601 and 602 are embodied such that they project from the housing 607 on in each case two sides of the component 600 and thus enable external contact-connection on both sides of the housing 607.

The components 100 to 600 may be used, for example, in electronic circuits for converting DC voltages, so-called DC-DC converters. DC-DC converters may be used to convert a DC input voltage provided by a battery or a rechargeable battery, for example, into a DC output voltage matched to the demand of electronic circuits connected downstream. DC-DC converters may be embodied as step-down converters, in which the output voltage is less than the input voltage, or as step-up converters, in which the output voltage is greater than the input voltage.

Figure 7:
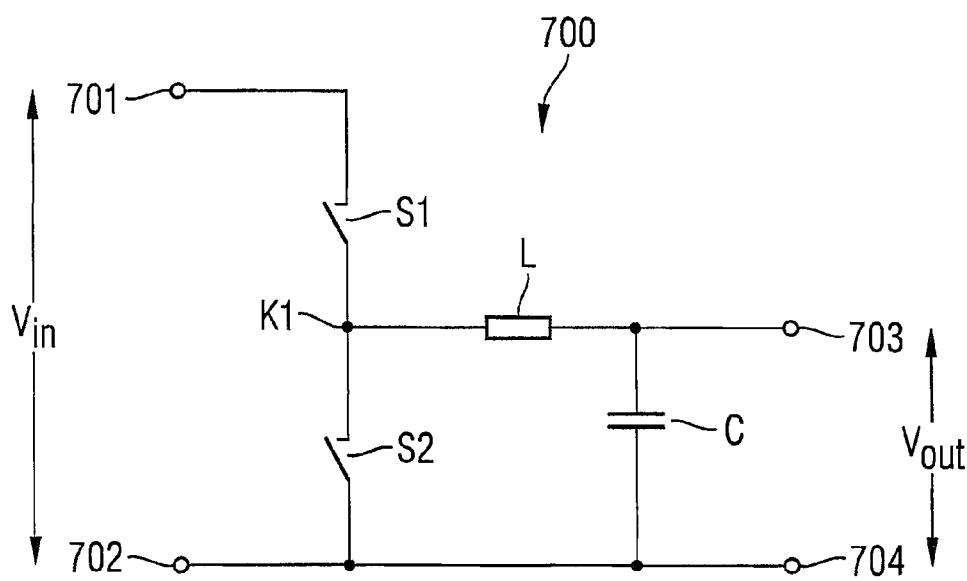
FIG. 7 shows a basic circuit of a DC-DC converter 700.

FIG. 7 shows a basic circuit of a step-down converter 700. In this case, two switches S1 and S2 are connected in the form of a half-bridge between two terminals 701 and 702. An inductance L is connected between a node K1, which is arranged between the two switches S1 and S2, and a terminal 703. The terminal 702 is furthermore connected to a terminal 704, and a capacitor C is connected between the terminals 703 and 704.

During the operation of the step-down converter 700, the switches S1 and S2 are reciprocally opened and closed. As a result, an input voltage $V_{in}$ present at the step-down converter 700 via the terminals 701 and 702 is converted into an output voltage $V_{out}$ by means of an induced voltage generated by the inductance L, which output voltage can be tapped off between the terminals 703 and 704. The output voltage $V_{out}$ is less than the input voltage $V_{in}$; its voltage value depends on the duty ratio of the two switches S1 and S2. The switching frequencies required may be up to several 100 kHz. The switches S1 and S2 may be realized by the power transistors or power diodes of the components 100 to 600.

Figure 8:
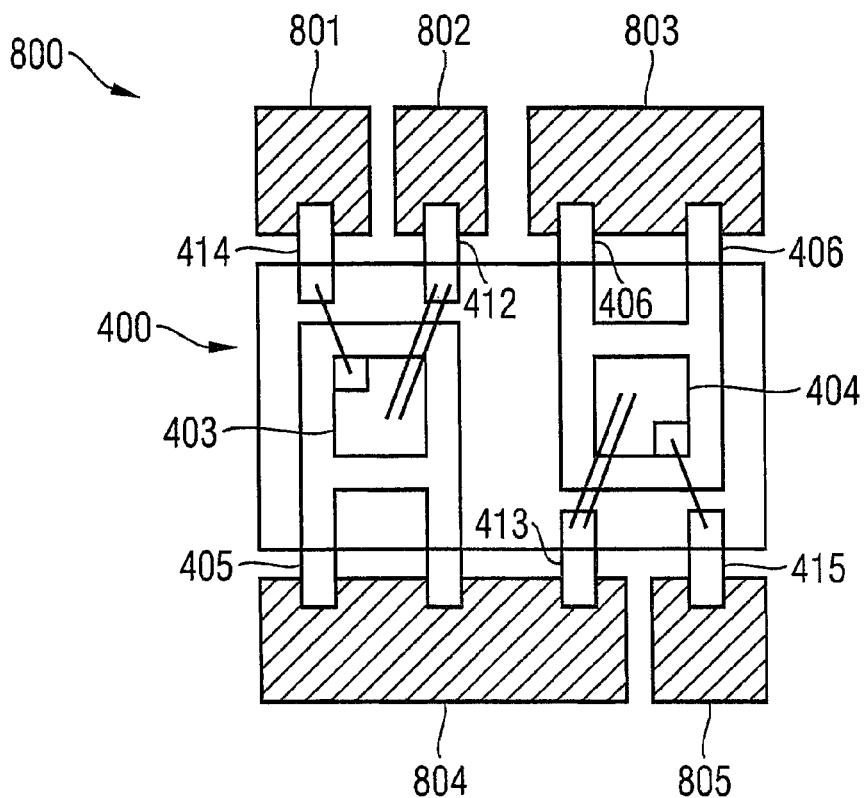
FIG. 8 shows a schematic illustration of a module 800 as a further exemplary embodiment.

FIG. 8 schematically illustrates an excerpt from a module 800 comprising a DC-DC converter. The module 800 has an electronics card, for example a PCB (Printed Circuit Board). Only contact areas 801 to 805 of the electronics card are illustrated in FIG. 8. As a representative example of the components 100 to 600, the component 400 has been mounted onto the electronics card by the external contact elements 405, 406 and 412 to 415 having been soldered to the contact areas 801 to 805. Specifically, the external contact element 414 has been soldered to the contact area 801, the external contact element 412 has been soldered to the contact area 802, the external contact elements 406 have been soldered to the contact area 803, the external contact elements 405 and 413 have been soldered to the contact area 804, and the external contact element 415 has been soldered to the contact area 805.

The two switches S1 and S2 are realized by the power transistors 403 and 404 in the module 800. Their current-carrying paths are the drain-source paths between the contact areas 802 and 804, and 803 and 804, respectively. The contact area 804 represents the node K1 and connects the two power transistors 403 and 404 to one another. The power transistors 403 and 404 are controlled via the contact areas 801 and 805.

One advantage of the component 400, as well as the components 100, 200, 300, 500 and 600, is that the external contact element coupled to the drain or collector terminal of one power transistor lies alongside the external contact element connected to the source or emitter terminal of the other power transistor. As a result, these two external contact elements, as is shown on the basis of the contact area 804 in FIG. 8, can be interconnected without this necessitating long conductor tracks on the electronics card. Furthermore, it is possible to avoid crossing conductor tracks on the electronics card, with the result that possibly only one or two metallization layers have to be applied to the electronics card. The same advantages also hold true for the case where the components 100 to 600 each have a power transistor and a power diode. In this case, the external contact element connected to the drain terminal of the power transistor and the external contact element connected to the anode terminal of the power diode are adjacent.

The components 100 to 600 are suitable not only for the application in DC-DC converters, but generally for any desired circuits containing half-bridges constructed from two switches. Half-bridges of this type may also be used in electric motors, for example.

FIGS. 9A to 9D illustrate a method for producing components. In principle, the components produced by the method described here may have the same configurations as the components 100 to 600 shown in FIGS. 1 to 6, but the leadframe used in each case must be adapted to the component to be fabricated. A method by which the component 400 shown in FIG. 4 can be fabricated is described by way of example below.

In a first method step (see FIG. 9A), a leadframe 900 is provided. The leadframe 900 is a metal strip which is composed of copper, for example, and which has stamped-out portions at specific locations. The leadframe 900 is hatched in FIG. 9A and the stamped-out portions are illustrated without hatching. The metal strip has been stamped out such that the carriers 401, 402 with the extensions 405, 406 and also the external contact elements 412 to 415 can be formed from it later.

In the next method step (see FIG. 9B), the leadframe 900 is equipped with semiconductor chips 403, 404. The semiconductor chips 403, 404 may be applied to the leadframe 900 successively or simultaneously. The semiconductor chips 403, 404 are applied to the leadframe 900 in such a way that their drain terminals in each case face the leadframe 900. Electrical connections are produced between the drain terminals and the leadframe 900 by means of soldering or adhesive bonding. Bonding wires are subsequently drawn from contact prongs 901 to 904 of the leadframe 900 to the source terminals 408, 409 and the gate terminals 410, 411 of the semiconductor chips 403, 404.

Figure 9A:
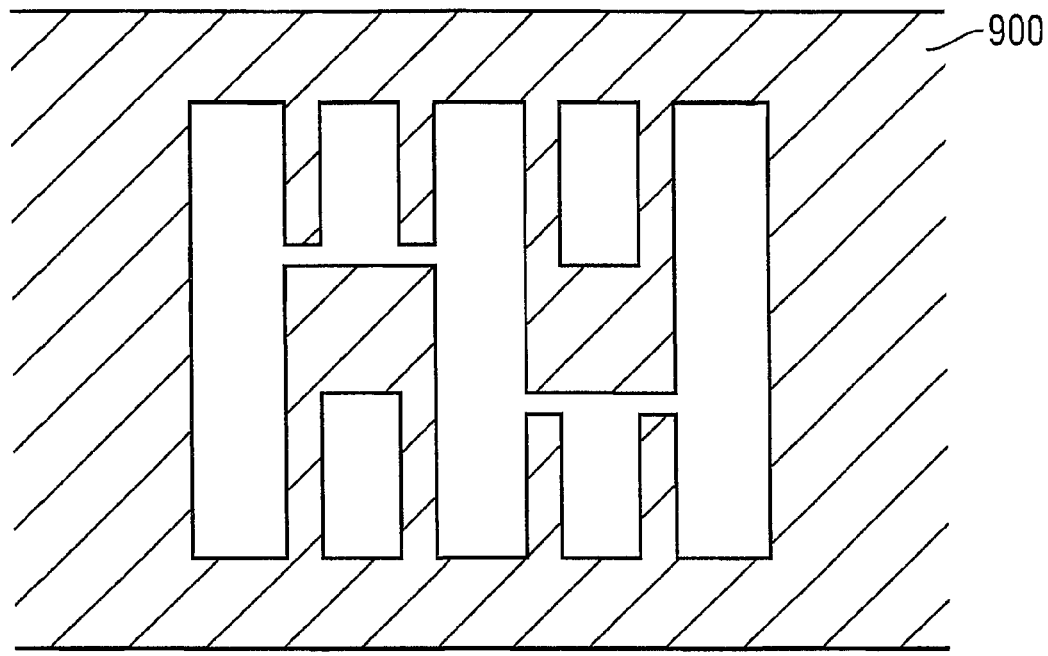
FIGS. 9A to 9D show a schematic illustration of a method for producing the component 400 as a further exemplary embodiment.
Figure 9B:
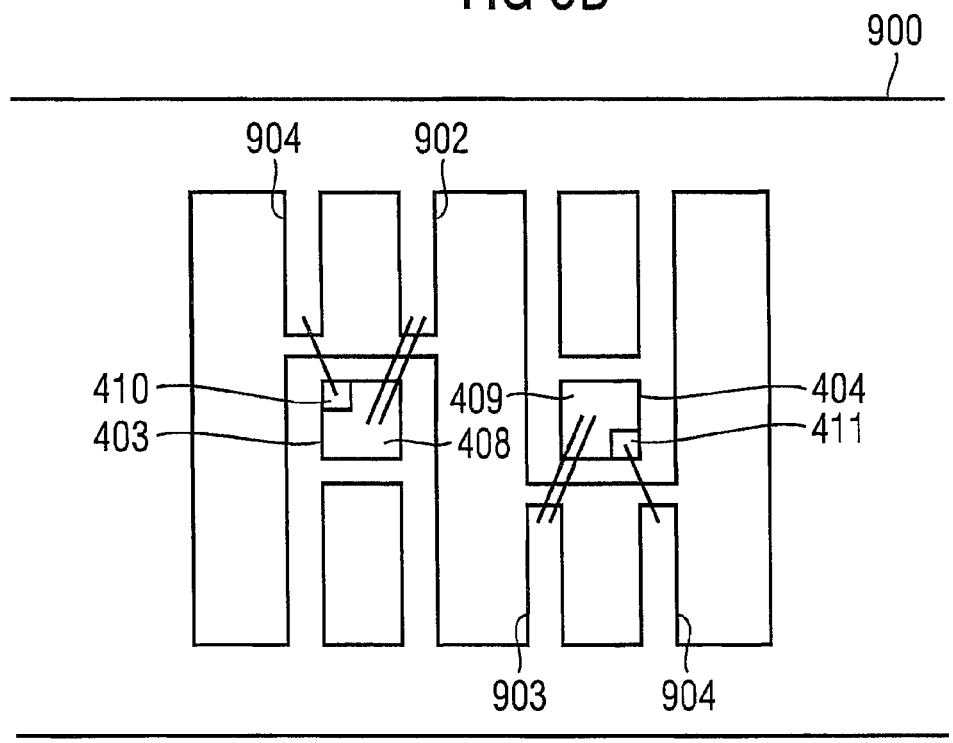
Figure 9C:
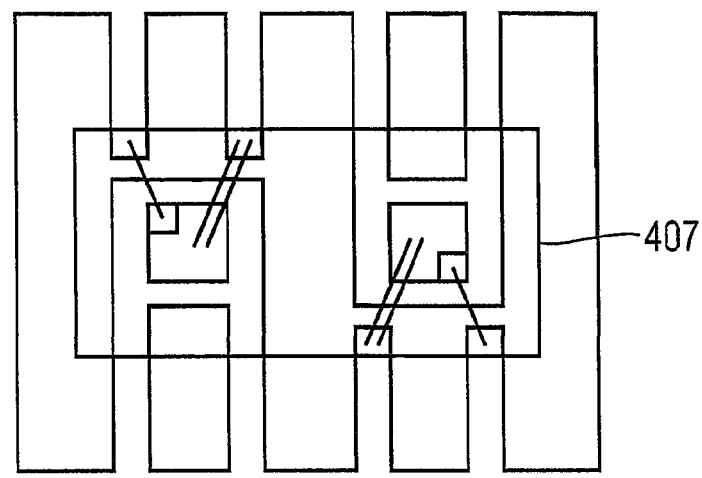
Figure 9D:
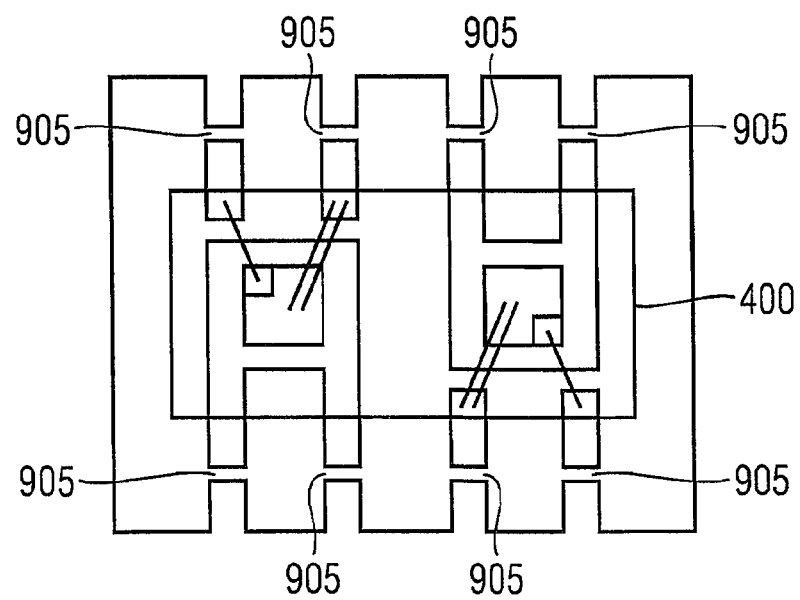

In the next method step, the arrangement is provided with a housing 407 (see FIG. 9C). For this purpose, by way of example, the semiconductor chips 403, 404 and also parts of the leadframe 900 are encapsulated by injection-moulding with an encapsulant, for example, a plastics composition, such that the bonding wires lie within the housing 407.

In the last method step, the contact prongs are severed at the locations 905 (see FIG. 9D), whereby the component 400 is released from the leadframe 900.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A component, comprising:
    a first carrier having a first extension forming a first external contact element;
    a first semiconductor chip having a vertical structure, a first main surface of the first semiconductor chip being attached to the first carrier;
    a second carrier having a second extension forming a second external contact element; and
    a second semiconductor chip having a vertical structure, a first main surface of the second semiconductor chip being attached to the second carrier, wherein the first and the second carrier are arranged in such a way that the first extension and the second extension point in different directions, wherein the first external contact element is arranged on a first exterior side of the component, wherein the second external contact element is arranged on a second exterior side of the component, and wherein the first semiconductor chip has a second and a third contact element on a second main surface, the second contact element of the first semiconductor chip being coupled to a third external contact element and the third contact element being coupled to a fifth external contact element, wherein the fifth external contact element is arranged on the first exterior side of the component, wherein the first and the second carriers and the first and the second semiconductor chips are integrated into a housing, wherein a portion of the third external contact element protruding outwards from the housing is wider than a portion of the first external contact element protruding outwards from the housing; and
    the second semiconductor chip has a second and a third contact element on a second main surface, the second contact element of the second semiconductor chip being coupled to a fourth external contact element, wherein a portion of the fourth external contact element protruding outwards from the housing is wider than a portion of the second external contact element protruding outwards from the housing.

2. The component according to claim 1, wherein the first and/or the second carrier are electrically conductive.

3. The component according to claim 1, wherein
    the first semiconductor chip has a first contact element on the first main surface that faces the first carrier, the first contact element of the first semiconductor chip being electrically coupled to the first carrier.

4. The component according to claim 1, wherein
    the fourth external contact element is arranged on the first exterior side of the component; and
    the third external contact element is arranged on the second exterior side of the component.

5. The component according to claim 1, wherein the first and second semiconductor chips have corresponding structures on their second main surfaces and the first and second semiconductor chips are arranged in such a way that the structures are rotated relative to one another.

6. The component according to claim 1, wherein the first and the second exterior sides point in opposite directions.

7. The component according to claim 1, wherein the first semiconductor chip comprises a power semiconductor chip.

8. An electronic module, comprising:
    an electronics card; and
    a component according to claim 1 attached to the electronics card.

9. The component according to claim 1, wherein the third contact element of the second semiconductor chip is coupled to a sixth external contact element and wherein the sixth external contact element is arranged on the second exterior side of the component.

10. The electronic module according to claim 8, wherein the first and the second semiconductor chips are wired on the electronics card to form a half-bridge.

11. The electronic module according to claim 10, wherein the electronic module comprises a DC voltage converter and the half-bridge is comprised by the DC voltage converter.

12. A component, comprising:
    external contact elements arranged in at least a first series and a separate second series;
    a housing comprising a first power transistor and a second power transistor;
    the first power transistor comprising
    a drain terminal coupled to a first external contact element,
    a gate terminal coupled to a third external contact element, wherein the gate terminal is coupled to the third external contact element through a first contact element disposed on a major surface of the first power transistor, and a source terminal coupled to a fourth external contact element through a second contact element, the second contact element disposed on the major surface, wherein a portion of the fourth external contact element protruding outwards from the housing is wider than a portion of the first external contact element protruding outwards from the housing; and the second power transistor comprising
a drain terminal coupled to a second external contact element,
a gate terminal coupled to a fifth external contact element, and
a source terminal coupled to a sixth external contact element, wherein the first, the third and the sixth external contact elements are arranged in the first series, and wherein the second, the fourth and the fifth external contact element are arranged in the second series.

13. An electronic module, comprising:
an electronics card; and
a component according to claim 12 attached to the electronics card.

14. The component according to claim 12, wherein the first and the second series are arranged at opposite sides of the component.

15. The electronic module according to claim 13, wherein the first and the second semiconductor chips are wired on the electronics card to form a half-bridge.

16. The electronic module according to claim 15, wherein the electronic module comprises a DC voltage converter and the half-bridge is comprised by the DC voltage converter.

17. A component, comprising:
external contact elements arranged in at least a first series and an opposite second series;
a housing comprising a power transistor and a power diode;
the power transistor comprising
a drain terminal coupled to a first external contact
a source terminal coupled to a second external contact element from the second series through a first contact element, the first contact element being disposed on a major surface of the power transistor, and
a gate terminal is coupled to a third external contact element from the first series through a second contact element disposed on the major surface, wherein a portion of the second external contact element protruding outwards from the housing is wider than a portion of the first external contact element protruding outwards from the housing; and
the power diode comprising
a cathode terminal coupled to a fourth external contact element; and
an anode terminal is coupled to a fifth external contact element, wherein a portion of the fifth external contact element protruding outwards from the housing is wider than a portion of the fourth external contact element protruding outwards from the housing, wherein the first, the third and the fifth external contact element are arranged in the first series, and the second and the fourth external contact element are arranged in the opposite second series.

18. A method, comprising:
providing a first carrier having a first extension forming a first external contact element and a second carrier having a second extension forming a second external contact element;

attaching a drain contact of a first semiconductor chip having a vertical structure to the first carrier;
attaching a drain contact of a second semiconductor chip having a vertical structure to the second carrier, the first carrier, the second carrier, the first semiconductor chip, and the second semiconductor chip forming a housing; and
connecting a first gate contact of the first semiconductor chip to a third external contact element;
connecting a second gate contact of the second semiconductor chip to a fifth external contact element;
connecting first a source contact of the first semiconductor chip to a fourth external contact element; and
connecting a second source contact of the second semiconductor chip to a sixth external contact element,
wherein the first, the third and sixth external contact elements point in a same first direction, wherein the second, the fourth and the fifth external contact element point in a second direction opposite to the first direction, wherein a portion of the fourth external contact element protruding outwards from the housing is wider than a portion of the first external contact element protruding outwards from the housing, and wherein a portion of the sixth external contact element protruding outwards from the housing is wider than a portion of the second external contact element protruding outwards from the housing.

19. The method according to claim 18, wherein attaching the first semiconductor chip to the first carrier comprises soldering the first semiconductor chip to the first carrier.

20. The method according to claim 18, farther comprising attaching a bonding wire between the first semiconductor chip and a third external contact element and attaching a bonding wire between the second semiconductor chip and a fifth external contact element.

21. The method of claim 18, wherein the first and second carrier are arranged in such a way that the first and second extensions point in different directions.

22. The method of claim 21, wherein the second and fourth external contact elements point in the same direction.

23. A component, comprising:
external contact elements arranged in at least a first series and a separate second series; and
a housing comprising a power transistor and a power diode,
the power transistor having a drain terminal coupled to a first external contact element from among the external contact elements, the power transistor having a source terminal and a gate terminal, the source terminal coupled to a second external contact element from the second series through a first contact element, the first contact element being disposed on a major surface of the power transistor, wherein the gate terminal is coupled to a third external contact element from the first series through a second contact element disposed on the major surface, wherein the second and the third external contact elements are disposed on opposite sides of the power transistor, wherein a portion of the second external contact element protruding outwards from the housing is wider than a portion of the first external contact element protruding outwards from the housing, and
the power diode having an anode terminal coupled to a second external contact element from among the external contact elements, wherein the first external contact element is adjacent to the second external contact element.

* * * * *

UNITED STATES PATENT AND TRADEMARK OFFICE
CERTIFICATE OF CORRECTION

PATENT NO.        : 8,120,161 B2
APPLICATION NO.   : 11/733658
DATED             : February 21, 2012
INVENTOR(S)       : Ralf Otremba et al.

It is certified that error appears in the above-identified patent and that said Letters Patent is hereby corrected as shown below:

In the Claims

In Col. 9, line 37, claim 17, after "external contact" insert --element--.
In Col. 9, line 42, claim 17, after "gate terminal" delete "is".
In Col. 9, line 52, claim 17, after "anode terminal" delete "is".

Signed and Sealed this
Twenty-ninth Day of April, 2014

Michelle K. Lee
*Deputy Director of the United States Patent and Trademark Office*